United States Patent [19]
Huang et al.

[11] Patent Number: 6,117,349
[45] Date of Patent: Sep. 12, 2000

[54] COMPOSITE SHADOW RING EQUIPPED WITH A SACRIFICIAL INNER RING

[75] Inventors: Yu Chih Huang, Taichung; Cherng Chang Tsuei, Taipei; Shuan Yu Chang, Taichung, all of Taiwan

[73] Assignee: Taiwan Semiconductor Manufacturing Company, Ltd., Hsin Chu, Taiwan

[21] Appl. No.: 09/141,698

[22] Filed: Aug. 28, 1998

[51] Int. Cl.[7] .............................. H01L 21/00; H05H 1/00
[52] U.S. Cl. ............................ 216/71; 438/729; 156/345
[58] Field of Search ............................ 156/345; 438/729, 438/710; 216/67, 71

[56] References Cited

U.S. PATENT DOCUMENTS 5,955,381  9/1999  Bitting et al. ............................ 438/710

*Primary Examiner*—Thi Dang
*Attorney, Agent, or Firm*—Tung & Associates

[57] ABSTRACT

A composite shadow ring for use in a plasma etch chamber that has a longer service life and can be readily replaced at a lower cost and a method for using such ring are disclosed. The composite shadow ring is constructed by a larger outer ring and a smaller inner ring which may be fabricated of quartz. The smaller inner ring has an upper planar surface for partially supporting an edge of an wafer and for exposing substantially to the gas plasma in the etch chamber. When the upper planar surface of the smaller inner ring is corroded by the gas plasma, the inner ring may be turned upside-down and reused, or when both sides have been corroded it can be readily replaced at a low cost without replacing the more expensive outer ring. The present invention composite shadow ring therefore presents a substantially lower cost shadow ring for use in an etching process than that possible with the conventional quartz shadow rings.

29 Claims, 1 Drawing Sheet

COMPOSITE SHADOW RING EQUIPPED WITH A SACRIFICIAL INNER RING

FIELD OF THE INVENTION

The present invention generally relates to a composite shadow ring for use in a plasma etch chamber and a method for using the ring and more particularly, relates to a composite shadow ring for use in a plasma etch chamber that is constructed of an outer ring and an inner ring with only the inner ring being substantially exposed to a gas plasma in the etch chamber such that only the inner ring needs to be replaced at each wet cleaning procedure and a method for using the composite shadow ring.

BACKGROUND OF THE INVENTION

In the fabrication of modern integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 μm or less for high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is thus used for such via formation process.

The via hole formation process can be enhanced by improving the etch directionality by a mechanism known as sidewall passivation to improve the anisotropy of the etching process. By utilizing a suitable etchant gas and suitable reactor parameters, an etch-inhibiting film of a polymeric nature can be formed on vertical sidewalls. The etch-inhibiting film slows down or completely stops any possible lateral etching of horizontal surfaces in the via hole. For instance, when a fluorine-containing etchant gas such as $CFH_3$ is used, a fluorine-type polymeric film is formed on the sidewalls. Many photoresist materials may also contribute to the formation of polymeric films on the sidewalls. After the sidewall is coated with a polymeric film, it is protected by the inhibitor film to preserve the line width or via hole diameter control.

In a modern etch chamber, an electrostatic chuck (or E-chuck), is frequently used in which the chuck electrostatically attracts and holds a wafer that is positioned on top. The use of E-chuck is highly desirable in the vacuum handling and processing of wafers. In contrast to a conventional method of holding wafers by mechanical clamping means where only slow movement is allowed during wafer handling, an E-chuck can hold and move wafers with a force equivalent to several tens of Torr pressure. Another advantage for the E-chuck is that no particle generation or contamination problem can occur since there are no moving parts acting on the wafer. Moreover, the electrostatic force utilized on an E-chuck is sufficient in preventing bowing of a wafer which normally occurs in mechanical clamping and thus promotes uniform heat transfer over the entire wafer surface.

In an etch chamber equipped with a plasma generating device and an E-chuck, a shadow ring may be utilized as a seal around the peripheral edge of the wafer. The shadow ring, also known as a focus ring, is utilized for achieving a more uniform plasma distribution over the entire surface of the wafer and for restricting the distribution of the plasma cloud to only the wafer surface area. The uniform distribution function may be further enhanced by a RF bias voltage applied on the wafer during a plasma etching process. Another function served by the shadow ring is sealing at the wafer level the upper compartment of the etch chamber which contains the plasma from the lower compartment of the etch chamber which contains various mechanical components for controlling the E-chuck. This is important since it prevents the plasma from attacking the hardware components contained in the lower compartment of the etch chamber. In order to survive high temperature and hostile environments, a shadow ring is frequently constructed of a ceramic material such as quartz.

In an etch chamber equipped with a high density plasma and an E-chuck, problems sometimes arise in the operation of the E-chuck. High density gas plasma formed has a short debye length and consequently vary small sheaths are formed at boundaries of objects that are present in the gas plasma. The debye length is defined as the distance from the plasma at which the electron density drops to 1/e of the electron density in the bulk plasma. The debye length can be calculated by first dividing the electron temperature by the electron density, and then taking the square root. The typical electron temperature in a high density plasma is low, i.e., on the order of a few eV. On the other hand, the electron density is high, i.e., on the order of $10^{11}$~$10^{12}$ electrons per cubic centimeter. This leads to a small debye length on the order of approximately several tenths of a millimeter. Gaps found in a process chamber that is larger than a few debye length may either cause a gas breakdown or the plasma may be extracted into the sufficiently large gaps.

In order to prevent the plasma from affecting the voltage on the electrode of the E-chuck, the electrode positioned in a plasma chamber must be sufficiently isolated from the plasma. In a typical E-chuck positioned in a high density plasma, the electrode has a voltage applied to it with respect to a ground reference point. The wafer is referenced back to the same ground reference by the plasma. The effective voltage for the electrostatic clamping of the wafer is then the voltage which appears across the E-chuck dielectric layer between the isolated electrode and the wafer. The voltage applied to the isolated electrode may be positive or negative with respect to the chamber ground. However, the electrostatic force depends on the algebraic difference between the wafer and the isolated electrode.

When the gaps around an E-chuck exceed several debye lengths, plasma may either be generated in the gaps or may be extracted into the gaps. When the plasma contacts the electrostatic chuck which has an imperfect dielectric layer or the E-chuck electrode, a current may flow between the E-chuck and the plasma. The voltage at the E-chuck electrode is therefore affected. Typically, the magnitude of the E-chuck voltage is reduced when a current flows between the chuck and the plasma which leads to a reduction in the electrostatic force. The efficiency of the E-chuck for holding a wafer is therefore affected. Ideally, the solution to the problem is to shield the E-chuck from the high density plasma by limiting gaps between the E-chuck and a shadow ring around the E-chuck to less than several debye lengths. In such an ideal situation, plasma can be prevented from being generated in the gaps or being extracted into the gaps. Since the ideal equipment conditions cannot be achieved in a manufacturing environment, the generation of plasma in the gaps or the extraction of plasma into the gaps and therefore attacking a shadow ring which is normally fabricated of quartz cannot be avoided. In a normal fabrication environment, it has been found that a quartz shadow ring would only survive about one preventive maintenance cycle or about 2,000 wafers. The corrosion occurred on the surface of the quartz shadow ring is usually severe enough that it must be replaced during a preventive maintenance procedure.

Referring initially to FIG. 1, wherein a conventional etch chamber 10 which is equipped with a shadow ring 12 installed around an electrostatic chuck 16 is shown. The etch chamber 10 is equipped with a coil antenna 14 as a plasma source in a reaction chamber 20 formed by a silicon ceiling block 22, a dome-shaped sidewall 24, a chamber wall liner 26 and the electrostatic chuck 16. The dome-shaped sidewall 24 and the chamber wall liner 26 are normally fabricated of quartz. The chamber wall liner 26 may be equipped with an opening for the passage of a wafer paddle in loading and unloading wafers. It may be removed from the vacuum chamber 10 for cleaning.

The shadow ring 12 is positioned inside the plasma reaction chamber 20 which can be lifted up to a process position by positioning pins 32. The positioning pins 32 lift the shadow ring 12 away from the wafer when a wafer is being loaded or unloaded. A multiplicity of cooling gas channels 34 is provided inside the electrostatic chuck 16 at near its top surface 36. A high heat conductivity gas such as helium can be circulated through the cooling gas channels 34 to provide a suitable gas pressure on the bottom side of wafer 30 for transferring heat away from the wafer to the water-cooled E-chuck 16 during an etch process. The supply lines for the cooling gas to channel 34 are not shown. The electrostatic chuck 16 is aligned by an electrostatic chuck collar 38. The etching gas is fed into chamber 20 through gas inlet 28. A thermal coupler 42 is mounted in the silicon ceiling block 22 for controlling temperature.

A cross-sectional view of a simplified E-chuck and shadow ring construction is shown in FIG. 2. In this conventional structure, the E-chuck 16 is positioned inside a shadow ring 12 which may be fabricated of quartz. The E-chuck 12 is constructed in a slightly different shape than the E-chuck 16 shown in FIG. 1, i.e., in a L shape. The lower part 40 of the L is provided with a planar top surface 44 which supports an edge portion 18 of the wafer 30. During an etching process, gas plasma 46 bombards a top surface 48 of the wafer 30. The gap 52 which is normally formed between the shadow ring 12 and the wafer 30 permits the gas plasma 46 to enter the gap and thus attacking the surface 44 of the shadow ring 12. After repeated use, the surface 44 can be substantially corroded by the gas plasma. A substantially corroded top surface 44 of the shadow ring 12 leads to a gap formed between the end portion 18 of the wafer 30 and the lower part 40 of the shadow ring 12. Such gap formation (not shown in FIG. 2) allows the gas plasma 46 to enter the lower chamber of the etch chamber and to attack the E-chuck or the components that operates the E-chuck. The plasma attack can seriously damage the E-chuck and its associated components leading to expensive repair.

It is therefore an object of the present invention to provide a shadow ring for use in a plasma etch chamber that does not have the drawbacks or shortcomings of the conventional shadow rings.

It is another object of the present invention to provide a shadow ring that is constructed of an outer ring and an inner ring which are intimately mated together for sealing around a wafer positioned on a E-chuck.

It is a further object of the present invention to provide a composite shadow ring which is constructed by an outer ring and an inner ring in such away that only the inner ring is subjected to attack by the gas plasma in the etch chamber.

It is another further object of the present invention to provide a composite shadow ring for use in a plasma etch chamber wherein only a small inner ring portion is subjected to plasma attack which can be readily replaced at low cost.

It is still another object of the present invention to provide a composite shadow ring for use in a plasma etch chamber which includes an outer ring and an inner ring with the latter being a sacrificial ring that can be readily replaced.

It is yet another object of the present invention to provide a plasma etch chamber for processing a semiconductor substrate which includes a shadow ring for engaging an edge portion of the semiconductor substrate with only an inner ring portion of the shadow ring being substantially exposed to the gas plasma.

It is still another further object of the present invention to provide a method for conducting an etching process in a plasma etch chamber that is equipped with a composite shadow ring wherein an inner ring portion of the composite shadow ring is subjected to attack by the gas plasma and can be readily replaced during a preventive maintenance procedure.

It is yet another further object of the present invention to provide a method for conducting an etching process in a plasma etch chamber which is equipped with a composite shadow ring by exposing only an inner ring portion of the shadow ring to the gas plasma and then replacing such inner ring during each preventive maintenance procedure without the need for replacing he entire shadow ring.

SUMMARY OF THE INVENTION

In accordance with the present invention, a composite shadow ring for use in a plasma etch chamber and a method for using such shadow ring are disclosed.

In a preferred embodiment, a composite shadow ring for use in a plasma etch chamber is provided which includes an outer ring with a lower recessed portion in an inner peripheral surface adapted for receiving an inner ring, the recessed portion is defined by an inner diameter and the inner peripheral surface further includes a non-recessed portion of a vertical surface that is not substantially affected by a gas plasma present in the etch chamber, and an inner ring which has an outer diameter smaller than the inner diameter of the outer ring such that the inner ring fits inside and is immediately adjacent to the recessed portion of the outer ring, the inner ring has an upper horizontal surface that is substantially affected by the gas plasma in the etch chamber.

The outer ring and the inner ring may be formed of at least one ceramic material. The outer ring and the inner ring may be formed of quartz. The inner ring is a sacrificial member which has a lifetime not more than half of that of the outer ring. The upper horizontal surface of the inner ring may further support an edge of a wafer. The shadow ring prevents gas plasma from contacting components in a lower compartment of the etch chamber. The shadow ring prevents gas plasma from contacting an electrostatic chuck situated in the etch chamber.

The outer ring and the inner ring may further have planar upper and lower surfaces. The composite shadow ring is normally positioned juxtaposed to a semiconductor substrate. The inner ring may overlap an edge of a semiconductor substrate on a planar upper surface. The inner ring may have a planar upper surface which overlaps an edge of a semiconductor substrate by at least 1 mm. The inner ring and the outer ring may have cross-sections of substantially rectangle or a square shape. The outer ring may have a cross-section of a rectangle with an inner lower corner of the rectangle missing to form a cavity for receiving the inner ring.

The present invention is further directed to a plasma etch chamber for processing a semiconducting substrate which includes means for generating a gas plasma of an etchant, means for holding a semiconductor substrate on a platform, and a shadow ring for engaging an edge portion of the semiconducting substrate and for forming substantially a seal between an upper chamber and a lower chamber separated by the semiconducting substrate, the shadow ring includes an outer ring which has a lower recessed portion in an inner peripheral surface adapted for receiving an inner ring, the recessed portion is defined by an inner diameter and the inner peripheral surface further has a non-recessed portion of a vertical surface that is not substantially affected by a gas plasma in the etch chamber, and an inner ring which has an outer diameter smaller than the inner diameter of the outer ring such that the inner ring fits inside and is immediately adjacent to the recessed portion of the outer ring, the inner ring has an upper horizontal surface that is substantially affected by the gas plasma during an etching process.

The platform for holding a semiconducting substrate may be an electrostatic chuck. The inner ring may be formed of quart and can be readily replaced. The inner ring and the outer ring may both be formed of quartz. The shadow ring prevents gas plasma from contacting components in a lower compartment of the etch chamber. The inner ring and the outer ring have cross-sections of substantially a rectangle. The shadow ring may be positioned juxtaposed to a semiconductor substrate. The inner ring overlaps an edge of a semiconductor substrate on a planar upper surface. The outer ring may have a cross-section of a rectangle with an inner lower corner missing for forming a cavity for receiving the inner ring.

The present invention is further directed to a method for conducting an etching process in a plasma etch chamber that is equipped with a shadow ring which includes the operating steps of first providing a plasma etch chamber that has a chamber cavity, then providing a platform for holding a semiconducting substrate in the cavity, then positioning a semiconducting substrate on the platform, then sealing an edge of the semiconducting substrate with a shadow ring such that an upper chamber and a lower chamber of the etch chamber are substantially isolated from each other, the shadow ring includes an outer ring adapted for intimately receiving an inner ring along an inner peripheral surface and an inner ring that fits inside the outer ring juxtaposed to the substrate with an upper surface substantially exposed to a gas plasma in the etch chamber, and then igniting a gas plasma for carrying out the etching process.

The method may further include the step of forming the inner ring in quartz, or forming the outer ring and the inner ring in quartz. The method may further include the step of forming the inner ring with quartz and replacing the inner ring when it is substantially corroded by the gas plasma. The method may further include the step of forming the inner ring and the outer ring in cross-sections of substantially a rectangle. The method may further include the step of forming the outer ring in a cross-section of a rectangle with an inner lower corner missing and thus providing a cavity for receiving the inner ring. The method may still include the step of sealing the edge of the semiconducting substrate by overlapping with a planar upper surface of the inner ring. The method may still further include the step of providing an electrostatic chuck for holding the semiconducting substrate in the plasma etch chamber.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
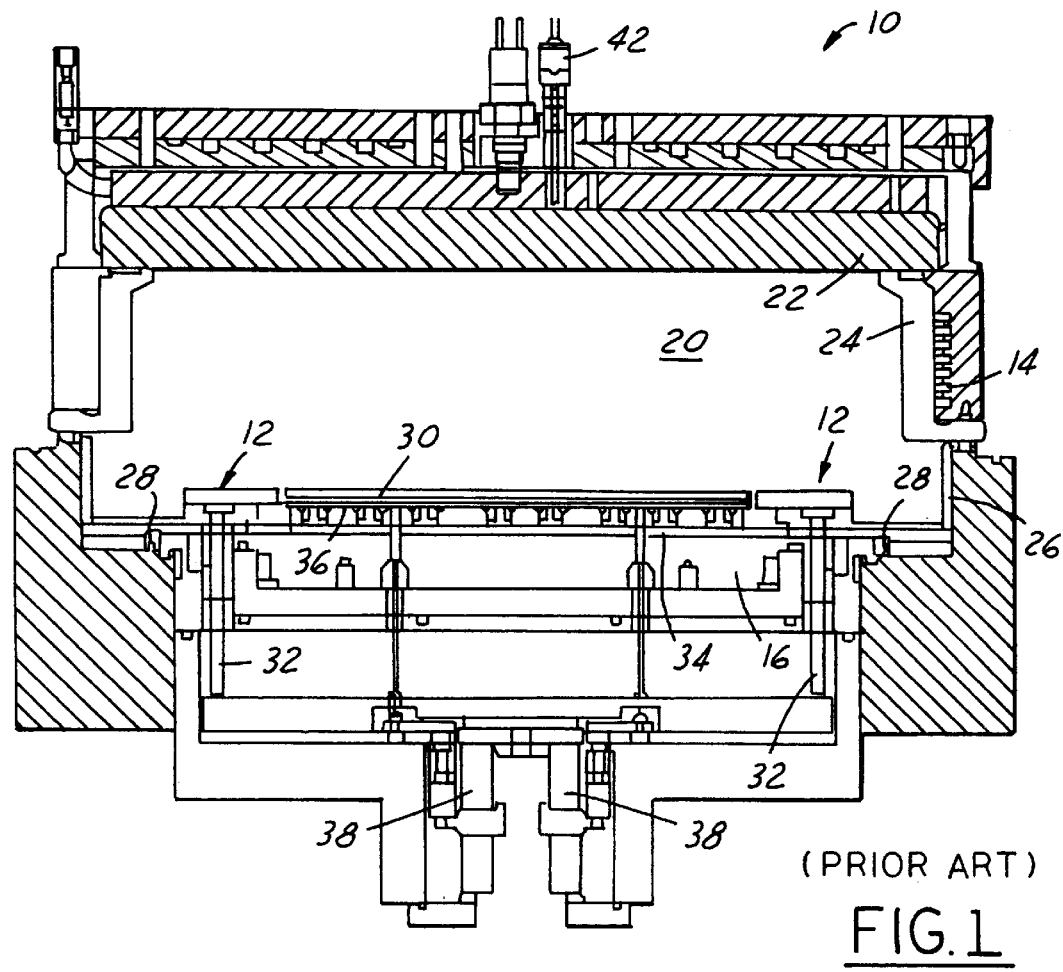
FIG. 1 is an illustration of a cross-section of a conventional etch chamber equipped with an electrostatic chuck and a shadow ring.
Figure 2:
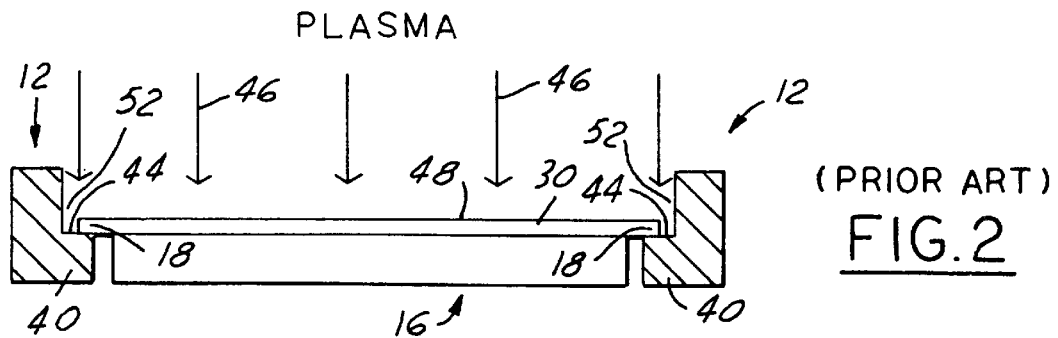
FIG. 2 is an illustration of a cross-section of a conventional E-chuck sealed by a shadow ring for isolating an upper chamber from a lower chamber.

The present invention discloses a composite shadow ring for use in a plasma etch chamber which includes an outer ring and an inner ring with only the inner ring being substantially exposed to gas plasma during an etching process so that when the inner ring is substantially corroded, only the inner ring needs to be replaced at a substantially lower cost. The present invention novel composite shadow ring avoids the expensive replacement of the entire shadow ring during each preventive maintenance procedure during which the components of the etch chamber is wet cleaned. The bulk portion of the composite shadow ring is the outer ring which does not need to be replaced for several preventive maintenance procedures. The overall lifetime of a shadow ring is thus improved by several folds. For instance, in contrary to a conventional shadow ring which must be replaced at high cost for every 2,000 wafers, the present invention novel composite shadow ring only needs the smaller part of the ring, i.e., the inner ring be replaced during the 2,000 wafer preventive maintenance procedure. The bulk or the larger part of the shadow ring, i.e., the outer ring, may last for at least between 8,000 and 10,000 wafers. In other words, the outer ring does not need to be replaced for at least 4 or 5 preventive maintenance procedures.

The outer ring and the inner ring of the present invention composite shadow ring can be fabricated of any ceramic material that is non-electrically conductive and can withstand high temperature exposure. A frequently used material is quartz. Even when the inner ring is substantially corroded in a top surface, the inner ring may be reversed and reused in an upside-down position for another preventive maintenance cycle since the bottom surface of the inner ring is mostly intact. A present invention composite shadow ring can therefore be constructed of two separate quartz rings, i.e., a quartz inner ring and a quartz outer ring. The quartz inner ring is placed around an E-chuck and the quartz outer ring is placed around the quartz inner ring. When used in an etching process, a wafer may be positioned on the E-chuck next to the inner ring by a robot blade. The plasma cloud generated in the etch chamber bombards the wafer surface and an upper planar surface of the quartz inner ring while the quartz outer ring is not substantially exposed to the gas plasma. When the quartz inner ring is substantially damaged by the gas plasma, it can either be reused in an upside-down position or can be replaced if the bottom surface has already been used. The quartz outer ring need not be replaced each time the quartz inner ring is replaced resulting in substantial cost savings since the quartz inner ring is substantially less expensive than the conventional quartz shadow ring.

The present invention novel quartz inner ring is therefore used as a sacrificial member of the composite shadow ring and as such, can be readily replaced at low cost without replacing the entire shadow ring.

Figure 3:
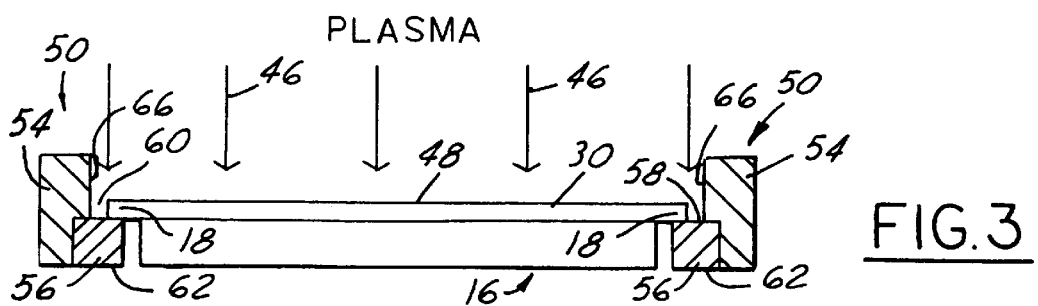
FIG. 3 is an illustration of a cross-section of the present invention composite shadow ring including an outer ring and an inner ring wherein only the inner ring is substantially exposed to gas plasma.

Referring now to FIG. 3 wherein a present invention composite shadow ring 50 is shown. The composite shadow ring 50 is constructed by an outer ring 54 and an inner ring 56. The inner ring 56 is positioned juxtaposed to a wafer 30 and supports an edge portion 18 of the wafer. As shown in FIG. 3, both the outer ring 54 and the inner ring 56 are formed in a substantially rectangular or square cross-section. The inner ring 56 may overlap an edge portion 18 of the wafer 30 on a planar upper surface 58 by at least 1 mm, and preferably by at least 3 mm. The outer ring 54 is provided with a cross-section of a rectangle which has an inner lower corner removed to form a cavity for receiving the inner ring 56. The outer ring 54 and the inner ring 56 may be fabricated of any suitable high temperature ceramic material that are non-electrically conductive. One of such widely used material is quartz. The outer ring 54 and the inner ring 56 may be fabricated of the same ceramic material, or may be fabricated of different ceramic materials as long as the coefficient of thermal expansion of the materials are sufficiently similar.

After a substantial exposure to gas plasma 46 has occurred on the upper planar surface 58 of the inner quartz ring 56, the upper planar surface 58 may be sufficiently corroded by the gas plasma such that it no longer forms a seal between the inner quartz ring 56 and the edge portion 18 of the wafer 30. Such substantial corrosion may occur after approximately 2,000 wafers have been processed in the etch chamber. The inner ring 56 may then be either replaced or may be turned upside-down and reused for another preventive maintenance cycle by utilizing the uncorroded bottom surface 62. This provides another cost saving feature in that the lifetime of an inner quartz ring is substantially doubled.

The effect of the gas plasma 46 on the vertical surface 56 of the outer quartz ring 54 is substantially less than that on the horizontal surface 58 of the inner quartz ring 56. This is because the gas plasma 46 bombards the surface 48 of the wafer in mostly a vertical direction and thus, only a small fraction of the gas plasma 46 would strike the vertical surface 66 of the outer quartz ring 54. As a result, the outer quartz ring 54 survives substantially more etch cycles without being severely damaged. For instance, the outer quartz ring 54 may have between 4 and 5 folds the lifetime of the inner quartz ring 56. The outer quartz ring 54 therefore needs to be replaced only for each 4 or 5 preventive maintenance cycles resulting in substantial cost savings since the outer ring represents a bulk of the composite shadow ring. The present invention therefore discloses a composite shadow ring in which an inner ring of smaller size is used as a sacrificial member of the composite ring. The small inner ring can be readily replaced at a substantially lower cost than the replacement of the entire shadow ring.

The present invention further discloses a plasma etch chamber for processing a semiconducting substrate which includes means for generating a gas plasma of an etchant gas, means for holding a semi-conducting substrate on a platform such as an electrostatic chuck, and a composite shadow ring for engaging an edge portion of the semiconducting substrate and for forming substantially a seal between an upper chamber and a lower chamber which are separated by the semiconducting substrate. The composite shadow ring has a structure substantially the same as that previously described of an outer ring and an inner ring which are fabricated of quartz with the inner ring readily replaceable at a low cost.

The present invention further discloses a method for conducting an etching process in a plasma etch chamber which is equipped with a composite shadow ring. The method may be carried out by first providing a plasma etch chamber which has a chamber cavity, then providing a platform such as an electrostatic chuck for holding a semi-conducting substrate in the cavity, then positioning a semi-conducting substrate on the platform or electrostatic chuck, then sealing an edge of the semiconducting substrate with a shadow ring such that an upper chamber and a lower chamber of the etch chamber may be substantially isolated from each other. The composite shadow ring is constructed substantially similarly to that previously described of an outer ring and an inner ring wherein the smaller inner ring is exposed to the gas plasma and can be readily replaced at low cost. The method may be started by igniting a gas plasma to carry out the etching process. The method may further include the step of replacing the smaller inner ring during each preventive maintenance procedure when the components of the etch chamber are wet cleaned.

The present invention novel composite shadow ring and a method for using such shadow ring have therefore been amply demonstrated in the above descriptions and in the appended drawing of FIG. 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for conducting an etching process in a plasma etch chamber equipped with a shadow ring comprising the steps of:

providing a plasma etch chamber having a chamber cavity, providing a platform for holding a semiconductor substrate in said cavity, positioning a semiconductor substrate on said platform, sealing an edge of said semiconductor substrate with a shadow ring such that an upper chamber and a lower chamber of said etch chamber are substantially isolated from each other, said shadow ring comprises an outer ring adapted for intimately receiving an inner ring along an inner peripheral surface and an inner ring that fits inside said outer ring positioned juxtaposed to said substrate having an upper surface substantially exposed to a gas plasma generated in said etch chamber, forming said inner ring in quartz, and igniting a gas plasma for carrying out said etching process.

2. A method for conducting an etching process in a plasma etch chamber equipped with a shadow ring according to claim 1 further comprising the step of forming said outer ring and said inner ring in quartz.

3. A method for conducting an etching process in a plasma etch chamber equipped with a shadow ring according to claim 1 further comprising the step of forming said inner ring with quartz and replacing the ring after it is substantially corroded by said gas plasma.

4. A method for conducting an etching process in a plasma etch chamber equipped with a shadow ring according to claim 1 further comprising the step of forming said inner ring and said outer ring in cross-sections of substantially a rectangle or a square.

5. A method for conducting an etching process in a plasma etch chamber equipped with a shadow ring according to claim 1 further comprising the step of forming said outer ring in a cross-section of a rectangle with an inner lower corner missing providing a cavity for receiving said inner ring.

6. A method for conducting an etching process in a plasma etch chamber equipped with a shadow ring according to claim 1 further comprising the step of sealing said edge of the semiconductor substrate by overlapping with a planar upper surface of said inner ring.

7. A method for conducting an etching process in a plasma etch chamber equipped with a shadow ring according to claim 1 further comprising the step of providing an electrostatic chuck for holding said semiconductor substrate in said plasma etch chamber.

8. A composite shadow ring for a plasma etch chamber comprising:

an outer ring having a lower recessed portion in an inner peripheral surface adapted for receiving an inner ring, said recessed portion being defined by an inner diameter, said inner peripheral surface further having a non-recessed portion of a vertical surface that is not substantially affected by a gas plasma in said etch chamber, and an inner ring having an outer diameter smaller than said inner diameter of the outer ring such that the inner ring fits inside and immediately adjacent to said recessed portion of said outer ring, said inner ring having an upper horizontal surface substantially affected by said gas plasma in said etch chamber.

9. A composite shadow ring for a plasma etch chamber according to claim 1, wherein said outer ring and said inner ring are formed of at least one ceramic material.

10. A composite shadow ring for a plasma etch chamber according to claim 1, wherein said outer ring and said inner ring are formed of quartz.

11. A composite shadow ring for a plasma etch chamber according to claim 1, wherein said inner ring is a sacrificial member having a lifetime not more than half of that of said outer ring.

12. A composite shadow ring for a plasma etch chamber according to claim 1, wherein said upper horizontal surface of said inner ring further supports an edge of a wafer.

13. A composite shadow ring for a plasma etch chamber according to claim 1, wherein said shadow ring prevents gas plasma from contacting components in a lower compartment of said etch chamber.

14. A composite shadow ring for a plasma etch chamber according to claim 1, wherein said shadow ring prevents gas plasma from contacting an electrostatic chuck situated in said etch chamber.

15. A composite shadow ring for a plasma etch chamber according to claim 1, wherein said outer ring and said inner ring having a planar upper and lower surface.

16. A composite shadow ring for a plasma etch chamber according to claim 1, wherein said composite shadow ring being positioned juxtaposed to a semiconductor substrate.

17. A composite shadow ring for a plasma etch chamber according to claim 1, wherein said inner ring overlaps an edge of a semiconductor substrate on a planar upper surface.

18. A composite shadow ring for a plasma etch chamber according to claim 1, wherein said inner ring having a planar upper surface which overlaps an edge of a semiconductor substrate by at least 1 mm.

19. A composite shadow ring for a plasma etch chamber according to claim 1, wherein said inner ring and said outer ring having cross-sections of substantially a rectangle or a square.

20. A composite shadow ring for a plasma etch chamber according to claim 1, wherein said outer ring having a cross-section of a rectangle with an inner lower corner of the rectangle missing forming a cavity for receiving said inner ring.

21. A plasma etch chamber for processing a semiconductor substrate comprising:

means for generating a gas plasma of an etchant, means for holding a semiconductor substrate on a platform, and a shadow ring for engaging an edge portion of said semiconductor substrate and for forming a seal between an upper chamber and a lower chamber separated by said semiconductor substrate, said shadow ring comprises:

an outer ring having a lower recessed portion in an inner peripheral surface adapted for receiving an inner ring, said recessed portion being defined by an inner diameter, said inner peripheral surface further having a non-recessed portion of a vertical surface that is not substantially affected by a gas plasma in said etch chamber, and an inner ring having an outer diameter smaller than said inner diameter of the outer ring such that the inner ring fits inside and immediately adjacent to said recessed portion of said outer ring, said inner ring having an upper horizontal surface substantially affected by said gas plasma in said etch chamber.

22. A plasma etch chamber for processing a semiconductor substrate according to claim 21, wherein said platform for holding a semiconductor substrate is an electrostatic chuck.

23. A plasma etch chamber for processing a semiconductor substrate according to claim 21, wherein said inner ring is formed of quartz and is readily replaceable.

24. A plasma etch chamber for processing a semiconductor substrate according to claim 21, wherein said inner ring and said outer ring are formed of quartz.

25. A plasma etch chamber for processing a semiconductor substrate according to claim 21, wherein said shadow ring prevents gas plasma from contacting components in a lower chamber of said etch chamber.

26. A plasma etch chamber for processing a semiconductor substrate according to claim 21, wherein said inner ring and said outer ring having cross-sections of substantially a rectangle or a square.

27. A plasma etch chamber for processing a semiconductor substrate according to claim 21, wherein said shadow ring being positioned juxtaposed to a semiconductor substrate.

28. A plasma etch chamber for processing a semiconductor substrate according to claim 21, wherein said inner ring overlaps an edge of a semiconductor substrate on a planar upper surface.

29. A plasma etch chamber for processing a semiconductor substrate according to claim 21, wherein said outer ring having a cross-section of a rectangle with an inner lower corner of the rectangle missing forming a cavity for receiving said inner ring.

* * * * *